RESETTABLE DELAY FLOP HAVING BLOCKING OSCILLATOR WHOSE CONDUCTION TIME IS DETERMINED BY CAPACITOR AND CLAMPING MEANS

Filed May 13, 1960 2 Sheets-Sheet 1

INVENTORS
AKIRA FUJIMOTO
JOHN G. NORDAHL
JESUS SANDOVAL

William G. Miller Jr.
AGENT

May 8, 1962 AKIRA FUJIMOTO ET AL 3,033,994

RESETTABLE DELAY FLOP HAVING BLOCKING OSCILLATOR WHOSE CONDUCTION TIME IS DETERMINED BY CAPACITOR AND CLAMPING MEANS

Filed May 13, 1960 2 Sheets-Sheet 2

INVENTORS
AKIRA FUJIMOTO
JOHN G. NORDAHL
JESUS SANDOVAL

William G. Miller Jr.
AGENT

United States Patent Office 3,033,994
Patented May 8, 1962

3,033,994

RESETTABLE DELAY FLOP HAVING BLOCKING OSCILLATOR WHOSE CONDUCTION TIME IS DETERMINED BY CAPACITOR AND CLAMPING MEANS

Akira Fujimoto, Philadelphia, Pa., John G. Nordahl, Boston, Mass., and Jesus Sandoval, Norristown, Pa., assignors to Sperry Rand Corporation, New York, N.Y., a corporation of Delaware Filed May 13, 1960, Ser. No. 28,893
12 Claims. (Cl. 307—88.5)

The present invention relates to "delay flops." A delay flop is a desirable element in certain computer circuits and is a device which produces an output signal in response to receipt of an input signal. This output signal is usually longer than or delayed in time with respect to said input signal, or one having a predetermined number of pulses.

A resettable delay flop is one in which the device will respond to a second input signal which arrives before occurrence of the output due to the first input signal. A non-resettable delay flop is one in which the device will not respond to a second input signal which arrives before occurrence of the output due to the first input signal. For example, in the case of a resettable delay flop a given input signal may produce an output pulse that after a predetermined time period following receipt of the input signal. A second input signal, received at the input prior to the expiration of the predetermined time period will prevent appearance of the output pulse for a similar predetermined time period following the second input signal. In a non-resettable delay flop, such a second control signal would have no effect.

The present invention relates to a delay flop of the resettable type although in its broadest aspects the resettable feature of the invention need not be used.

It is a primary object of this invention to provide an improved delay flop circuit.

It is a further object of this invention to provide an improved delay flop circuit which can be reset during the delay period.

Another object of this invention is the provision of a resettable delay flop having both improved accuracy and stability.

Still another object of this invention is the provision of an improved circuit for producing an output signal at a predetermined time after a group of periodic input signals have ceased.

Another object of this invention is the provision of a delay flop which utilizes a regenerative amplifier which requires only a small trigger pulse to start the delay period.

In carrying out the above object, this invention provides a delay flop which comprises an amplifier having an input circuit and an output circuit coupled to provide regenerative feedback. The amplifier is normally biased to a cutoff condition and is changed to a conductive state by a change in bias produced in response to a trigger signal. The regenerative feedback tends to maintain the conductive state. A capacitor is connected so that it is charged by current in the output circuit of the amplifier when the amplifier is in a conductive state. Means are provided for terminating the conductive state of the amplifier when the capacitor has become charged to a certain potential, the terminating means including means for controlling the amplifier bias. When the amplifier becomes non-conductive, the capacitor discharges through its discharge circuit and upon discharging to a certain potential causes an output circuit to produce a signal.

The foregoing objects, advantages and novel features of this invention both to its organization and mode of operation may be best understood from the following description when read in connection with the accompanying drawings, in which like reference numerals refer to like parts and in which.

Figure 1:
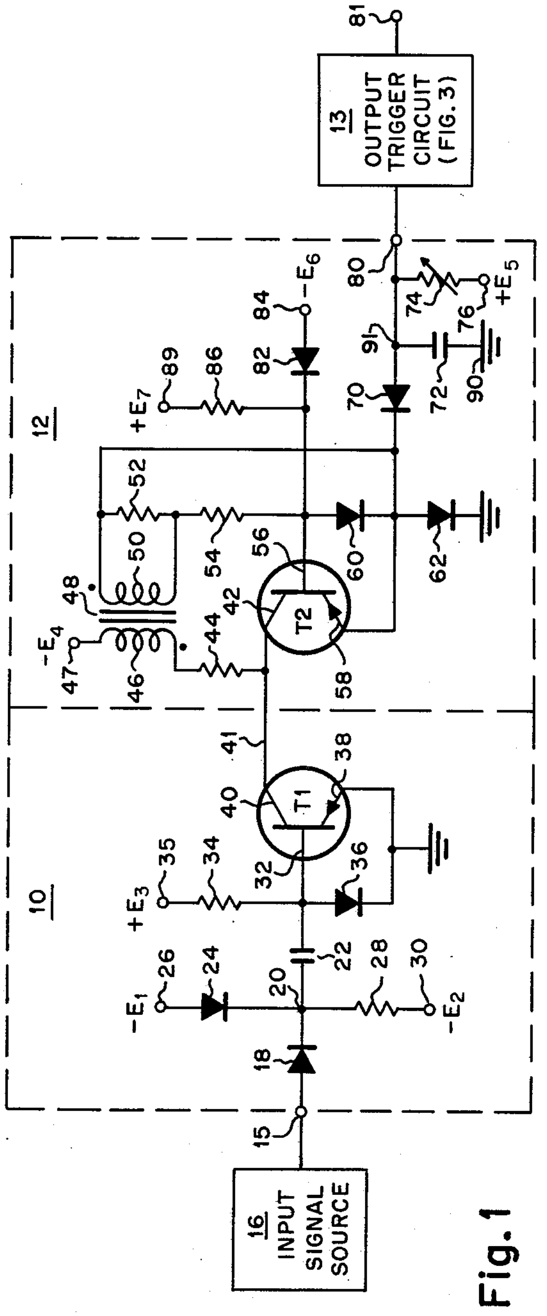
FIGURE 1 is a circuit diagram showing a resettable delay flop and its associated input trigger circuit.

One form of this invention is shown as the resettable delay flop of FIGURE 1. This circuit includes the input trigger circuit 10, the resettable timing circuit 12 and the output trigger circuit 13. The input trigger circuit 10 receives input signals at terminal 15. This terminal is connected to the anode of an input isolation diode 18 whose cathode is connected to a junction point 20. This junction point is, in turn, connected to a differentiating capacitor 22. The junction 20 is also connected to a clamp circuit comprising diode 24 which connects at terminal 26 to the negative terminal of a source of potential $-E_1$ in a manner to allow the flow of current to the junction point 20 from that source. The clamp circuit also includes resistor 28 which connects the junction point 20 to the negative terminal of a source $-E_2$ at terminal 30. The potential at terminal 30 will normally be more negative than that of terminal 26 whereby the clamp circuit prevents terminal 20 from going below the potential $-E_1$.

The other terminal of the differentiating capacitor 22 is connected to the base 32 of transistor $T_1$. The base 32 is also connected by way of a resistor 34 to the positive terminal of a source of potential $+E_3$ at terminal 35. The base 32 has another connection to the anode of a diode 36 whose cathode is connected to the grounded emitter 38 of transistor $T_1$.

The collector 40 of transistor $T_1$ is connected to the resettable timing circuit 12 by way of the connecting line 41. The connection to the resettable timing circuit 12 is made at collector 42 of transistor amplifier $T_2$. The collector 42 of transistor amplifier $T_2$ is also connected through a resistor 44 and the primary 46 of a feedback transformer 48 to a negative terminal 47 of a source of potential $-E_4$ to form the output circuit of transistor amplifier $T_2$. The secondary 50 of the feedback transformer 48 is shunted by resistor 52 and the combination of the secondary 50 and the resistor 52 are connected in series through a resistor 54 to the base 56 of transistor amplifier $T_2$ and to the emitter 58 of transistor $T_2$ to form the input circuit of transistor amplifier $T_2$. There is also connected between the base 56 and the emitter 58 a diode 60 which is poled to carry current from the base 56 to the emitter 58. The emitter 58 is also connected through diode 62 to a ground connection, which diode 62 is poled to carry current from the emitter 58 to the ground connection.

The emitter circuit of transistor $T_2$ is connected through a diode 70 to a timing capacitor 72 which has its other terminal connected to ground. The diode 70 is connected to have its anode connected to the timing capacitor 72. The anode of diode 70 is also connected to a resistor 74 which has its other terminal connected to the positive terminal of a source of potential $+E_5$ at terminal 76. The anode of the rectifier 70 is likewise connected to the output terminal 80 of the resettable timing circuit 12. The terminal 80 is, in turn, connected to the output trigger circuit 13 shown as a block having an output terminal 81.

The base 56 of transistor $T_2$ is connected through diode 82 to a negative terminal 84 of a source of potential $-E_6$. The diode 82 is oriented so that its anode is connected to the terminal 84. The cathode of the diode 82 is connected through resistor 86 to the positive terminal of a source of potential $+E_7$ at terminal 89.

Figure 2:
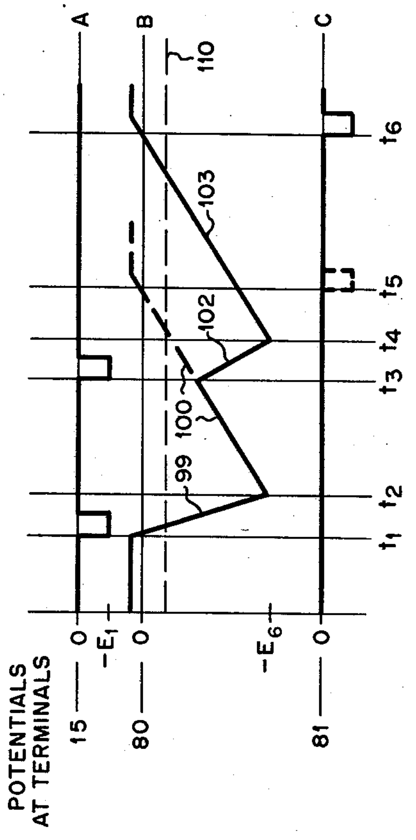
FIGURE 2 is a timing diagram showing the variations of the input to the input trigger circuit and the resulting output of the resettable timing circuit and the output trigger circuit.
Figure 3:
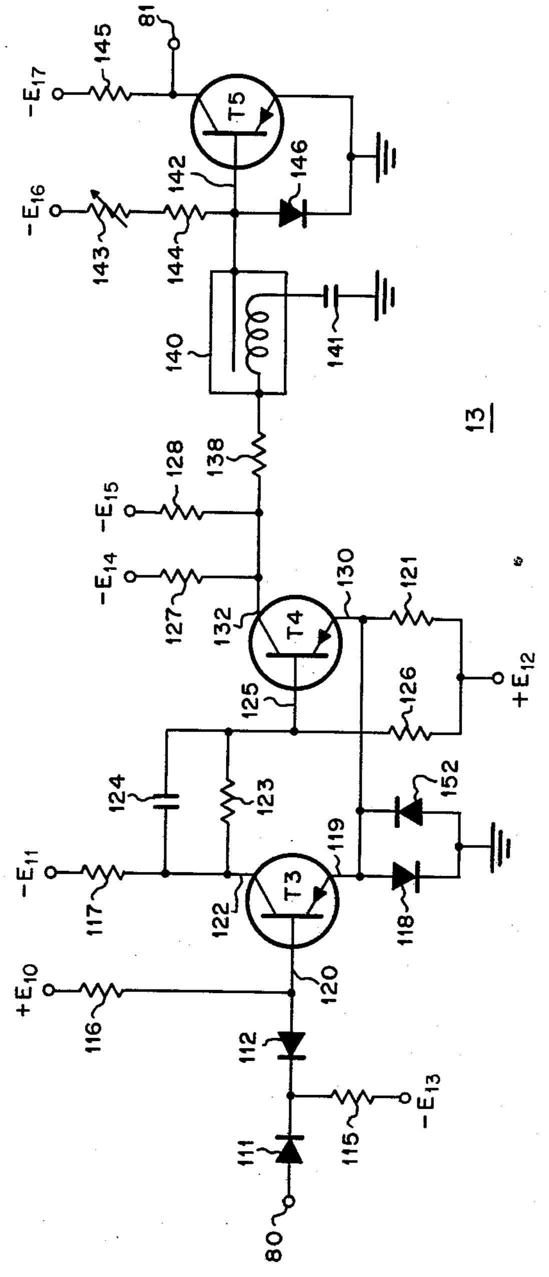
FIGURE 3 is a circuit diagram for one form of triggering circuit which can be used in conjunction with the delay flop of FIGURE 1.

The operation of the resettable timing circuit of FIGURE 1 in conjunction with its input trigger circuit, and its output trigger circuit will be evident from the following explanation of the circuit of FIGURE 1 in conjunction with the timing diagram of FIGURE 2 and the circuit of FIGURE 3. In the absence of an input signal, the potential at input terminal 15 remains at ground, and, assuming the source 16 of that ground potential has a low impedance, it is evident that there is, under normal conditions, current flow through the diode 18 and the resistor 28 to the terminal 30. This current tends to maintain a junction 20 at substantially ground potential. Since the potential at terminal 20 is higher than the potential at terminal 26, the diode 24 is cutoff.

The base 32 of transistor $T_1$ also is normally clamped to a potential which is substantially ground potential by current flow from the source $+E_3$ at terminal 35 through resistor 34 and diode 36. Thus, the differentiating capacitor 22 normally has no charge and the transistor $T_1$ having its emitter 38 and its base 32 both at ground potential is non-conductive.

The input signals from source 16, received at terminal 15 are desirably of the type shown along line A of FIGURE 2, such as at time $T_1$. These pulses go from a zero potential to a negative potential $-E_1$ equal to the potential at terminal 26. When the terminal 15 goes negative, the junction 20 also goes negative as a result of current flow from terminal 26 through diode 24 and resistor 28. The current flow from terminal 26 prevents overloading of the input signal source during the input period. The negative-going excursion of junction 20 causes a charging current to flow by way of emitter 38 and base 32 of transistor $T_1$. Until this charging current has built up a charge on capacitor 22, the base 32 of transistor $T_1$ is negative with respect to the ground potential at the emitter 38, thus providing the necessary emitter-base bias to cause transistor $T_1$ to become conductive.

Transistor $T_1$ thus produces by way of its collector 40 a trigger pulse on connecting line 41 in response to the negative input pulse at terminal 15. The trigger pulse is, of course, a sharp pulse which will cease after differentiating capacitor 22 charges up. The value of capacitor 22 substantially determines the duration of the input trigger pulse. This trigger pulse need only be sufficient to start the conduction of transistor $T_2$ as explained below.

Assuming transistor $T_2$ is in a non-conductive state before the occurrence of a trigger pulse on the connecting line 41, the trigger pulse flows through the resistor 44 and the primary 46 of the feedback transformer 48. The polarity of the primary and the secondary of the feedback transformer is indicated by the usual "dot" convention. From the indicated polarity of the windings on transformer 48, it is evident that the current through the primary 46, as a result of the trigger pulses from the trigger circuit 10, causes the secondary 50 to have induced in it a potential which is of polarity to bias the emitter 58 of transistor $T_2$ to a higher potential than the base 56 cutting off the diode 60 between the base and emitter. This bias between the emitter 58 and the base 56 causes transistor $T_2$ to become conductive. This conduction, in turn, produces increased current in the output circuit of the transistor amplifier, namely resistor 44 and the primary winding 46, from collector 42. This increase in current, in turn further increases the base-emitter bias as a result of the increased potential it induces in the secondary 50. The increased bias then causes a further increase in the collector current to provide additional regenerative feedback through the feedback transformer 48 and causes the transistor $T_2$ to saturate.

When the transistor $T_2$ is rendered conductive, the current therethrough flows through capacitor 72 and from the terminal 91 of the capacitor 72, through the diode 70 to the emitter 58 of transistor $T_2$. This current flow charges the timing capacitor 72 so that its terminal 91 becomes more negative than the grounded terminal 90 as shown by curve 99 along line B of FIGURE 2.

It should be noted that as long as the base 56 of the transistor $T_2$ is at a potential higher than that of terminal 84, the diode 82 will be cutoff.

As the capacitor 72 increases its charge, the terminal 91 of the capacitor 72 goes more negative and approaches the potential $-E_6$. When the potential of the base 56 goes below the potential at terminal 84, namely $-E_6$, the diode 82 becomes conductive and tends to clamp the potential of the base 56 at a potential $-E_6$. The effect of this clamping of the base is to decrease the bias between the emitter 58 and the base 56 which, in turn, decreases the collector current through the primary 46 of the feedback transformer 48. This decrease in the collector current produces degenerative feedback which shuts off the transistor $T_2$ since the decreasing collector current reverses the potential of the secondary 50. As soon as transistor $T_2$ is cut off, diode 70 becomes back biased by $+E_7$ via resistor 86 and diode 60 and isolates the capacitor 72 which then discharges through resistor 74 and the source of potential connected to terminal 76. Simultaneously, current flow to base 56 from source $+E_7$ through resistor 86 tends to quickly clean up the minority carriers in transistor $T_2$. Due to rapid turn off of $T_2$, there is provided both a definite time after $T_2$ starts conducting at which the discharging of capacitor 72 starts and a definite charge ($E_c$) which must be subsequently dissipated by capacitor 72. This provides high accuracy in the length of the delay time. The point at which the discharge of capacitor 72 begins is shown as time $t_2$ by the curve on line B of FIGURE 2. Line B of FIGURE 2 represents the variations in potential at the output terminal 80 in response to input signals at terminal 15 as shown along line A of FIGURE 2.

Barring the appearance of another input pulse at terminal 15 of the trigger circuit 10, the capacitor 72 continues to discharge and the potential at terminal 80 steadily decreases, as shown by line 100 of line B, FIGURE 2, a part of which is shown as a dash line.

Terminal 80 may desirably be connected to the input of an output trigger circuit 13 which may be a Schmitt trigger circuit which as is known to those skilled in the art can be designed to produce a pulse such as that shown by a dash line on line C of FIGURE 2 at $t_5$ whenever the potential of line 80 goes through the zero potential point in a positive-going direction. Trigger circuits of this type and other suitable types are well known in the art, and it will be evident to those skilled in the application of such circuits that various types of outputs may be obtained as a result of changing potential at terminal 80 and the particular response of a Schmitt trigger circuit as mentioned above is only one example.

Assuming that the output trigger circuit is a Schmitt trigger circuit as mentioned above and that it is connected to the terminal 80, the output of the Schmitt trigger circuit may produce a pulse at the time $t_5$ (line C, FIGURE 2) when the potential at terminal 80 goes through zero potential, then it is evident that the delay time between the input to the terminal 15 of the trigger circuit 10 and the output of the output trigger circuit 13 at time $t_5$ is that period between $t_1$ and $t_5$. This is the delay of the delay flop.

The duration of the delay may be adjusted by varying the resistance of the variable resistor 74 or alternatively by changing the capacity of the capacitor 72. To make an extensive change in the delay period, it may be necessary to alter both the resistance of resistor 74 and the capacity of capacitor 72. The accuracy of the delay period may be increased by including in the potential sources $-E_6$ and $+E_5$ voltage regulating means which closely maintains the desired potentials at terminals 84 and 76.

As previously mentioned, it is desirable that delay flops be resettable for various applications in computer circuits. The timing circuit 12 may, for example, be reset by the appearance of an input pulse at terminal 15 at the time $t_3$ as shown on line A of FIGURE 2. The appearance of this input pulse at time $t_3$ causes the trigger circuit 10 to produce another trigger pulse at the line 41 which, as previously explained, causes transistor $T_2$ to become conductive at time $t_3$. The capacitor 72, which has been discharging since the time $t_2$, again is charged by the emitter collector current of transistor $T_2$. This charging of capacitor is shown by line 102 (line B of FIGURE 2) as an increasing negative potential at terminal 80. As this potential reaches substantial equality with the potential at terminal 84, namely $-E_6$, the transistor $T_2$ is regeneratively cutoff at time $t_4$, and the capacitor 72 again discharges through its discharge circuit causing the potential at terminal 80 to follow the line 103.

When the potential at terminal 80 crosses the zero potential point, it causes the output trigger 13 circuit connected to terminal 80 to produce an output pulse as shown at time $t_6$ on line C of FIGURE 2. The delay flop shown in FIGURE 1 is thus resettable at any time after transistor $T_2$ becomes non-conductive, and no output is produced from the output trigger circuit 13 until there has been no input to the terminal 15 of the input trigger circuit 10 for a period at least equal to the discharge time of the capacitor 72, as for example, the period between $t_4$ and $t_6$ which would be equal to the period between $t_2$ and $t_5$.

An example of an output triggering circuit 13 of FIGURE 1 which will produce pulses of the type shown on line C of FIGURE 2 is shown in detail in FIGURE 3 wherein the terminals 80 and 81 correspond to the terminals 80 and 81 of FIGURE 1.

The first stage of the output triggering circuit, namely transistor $T_3$, is biased by the potential sources $+E_{10}$, $-E_{11}$, and $-E_{13}$ in combination with the resistors 115, 116 and 117 so that when the terminal 80 is at a potential above a "reset" potential shown as line 110 along line B of FIGURE 2, after going above a "set" potential of higher value shown as the "0" E.M.F. line the transistor $T_3$ will be non-conductive. In such a non-conductive state, the emitter 119 of transistor $T_3$ has a potential slightly above ground due to the voltage drop caused by current flow from source $+E_{12}$ through resistor 121 and diode 118. As the potential at point 80 goes negative to the point 110 (FIGURE 2), diode 111 becomes back-biased and diode 112 becomes forward biased so that the potential at the base 120 of transistor $T_3$ goes to a point sufficiently below the potential of the emitter 119 to cause the transistor $T_3$ to become conductive. This causes an increase in the potential appearing at its collector 122, and by way of resistor 123 and speed-up capacitor 124, there is a consequent increase in potential at the base 125 of transistor $T_4$.

Transistor $T_4$, prior to the above described change in its base potential, is in its normal conductive state as a result of the biases between its emitter 130 and its base 125 as well as the biases between its collector 132 and emitter 130. These biases are established by the various potential sources $-E_{14}$, $-E_{15}$, $+E_{12}$ and $-E_{11}$ in combination with the resistors 117, 123, 126, 121, 127 and 128.

When transistor $T_3$ becomes conductive, the corresponding increase in the potential at the base 125 of transistor $T_4$ makes it non-conductive. The non-conductive state of transistor $T_4$ causes a decrease in the potential at its collector 132. This decrease is transmitted through the resistor 138 and the combination of delay line 140 and capacitor 141 to the base 142 of transistor $T_5$. Transistor $T_5$, as a result of the biases impressed on it by the potential sources $-E_{16}$ and $E_{17}$, is normally in a conductive state except when a positive-going change in potential is produced at the collector 132 of transistor $T_4$. Thus, a negative-going change in potential at collector 132 does not affect the output at terminal 81 which stays at substantially ground potential until the potential at terminal 80, as shown in FIGURE 2, is positive-going through the zero potential level along curve 100 or 103. At this point, as for example at time $t_5$ or $t_6$, the transistor $T_3$ will be turned off due to the increase of the potential at the base 120 above the potential of the emitter 119. It should here be noted that whenever the transistor $T_3$ is non-conductive the emitter 119 is at a potential slightly below ground due to the potential drop across diode 152 when $T_3$ is conductive, $T_4$ is non-conductive, and diode 118 conducts via resistor 121 to keep emitter 119 above ground. Thus the potential at the emitter 119 of $T_3$ is more positive (by the voltage drops across both diodes 118 and 152) during conduction than during the non-conductive state. It is therefore, necessary that the base 120 of transistor $T_3$ be more positive in order to cause transistor $T_3$ to cutoff than is necessary in order to make the transistor $T_3$ conductive. This is illustrated by the fact that the point 110 of FIGURE 2 at which the transistor $T_3$ becomes conductive is below the zero potential level which is the point where the transistor $T_3$ becomes non-conductive.

Non-conduction in transistor $T_3$ causes base 125 of transistor $T_4$ to go negative thus once again turning transistor $T_4$ on. When transistor $T_4$ is turned on, the potential at the collector 132 goes positive, and this positive pulse is transmitted via resistor 138 and delay line 140 to the base 142 of transistor $T_5$. The positive potential thus produced at the base 142 causes the transistor $T_5$ to cutoff and produce a negative-going potential at output terminal 81. The potential at the collector 132 is positive during conduction of transistor $T_4$ and the current through the delay line 140 to base 142 exists only for a short period until current builds up through the inductance of delay line 140 and capacitor 141. The positive potential at base 142 then disappears and causes $T_5$ to become conductive and raise the potential at output terminal 81 back to its normal value. This is the trailing edge of the output pulses shown along line C of FIGURE 2.

It can be seen from the above explanation that the negative-going potential change at terminal 80 does not produce any output at terminal 150 while the positive-going potential change at terminal 80 will upon reaching a zero potential level, for example, produce a pulse output at terminal 81 with the duration of the pulses being determined by the delay line 140 and capacitor 141.

It will be evident to those skilled in the art that Schmitt trigger circuits having a different output stage than that shown in FIGURE 3 can be utilized to produce other types of output signals at terminal 81, as for example, a D.C. level which is maintained for the duration of the delay of the delay flop.

The circuits of FIGURES 1 and 3 may have the following values for their elements with an input pulse which goes from 0 to −3 volts in order to produce an output pulse of .85 µsec. after a delay period of substantially 330 µsec.

| Resistor: | Ohms |
|---|---|
| 28 | 18,000 |
| 34 | 39,000 |
| 44 | 68 |
| 52 | 50 |
| 54 | 0–22 |
| 86 | 10,000 |
| 74 | 10,000 |
| 115 | 20,000 |
| 116 | 22,000 |
| 117 | 2,000 |
| 121 | 1,800 |
| 123 | 500 |
| 126 | 10,000 |
| 127 | 680 |
| 128 | 1,500 |
| 138 | 1,000 |
| 143 | 10,000 |
| 144 | 8,200 |
| 145 | 1,000 |
| Capacitors: | $\mu\mu$f |
| 22 | 180 |
| 124 | 330 |
| 141 | between 0 and 18 |
| 72 | .10 |
| Voltage source: | Volts |
| $-E_1$ | −3 |
| $-E_2$ | −28 |
| $+E_3$ | +12 |
| $-E_4$ | −28 |
| $+E_5$ | +28 |
| $-E_6$ | −11 |
| $+E_7$ | +12 |
| $+E_{10}$ | +12 |
| $-E_{11}$ | −11 |
| $+E_{12}$ | +12 |
| $-E_{13}$ | −28 |
| $-E_{14}$ | −3 |
| $-E_{15}$ | −11 |
| $-E_{16}$ | −11 |
| $-E_{17}$ | −3 |
| Transistors: | Type |
| $T_1$ | RT52 |
| $T_2$ | RT53 |
| $T_3$ | RT13 |
| $T_4$ | RT13 |
| $T_5$ | RT13 |
| Diodes: | |
| 18 | XR25 |
| 24 | XR25 |
| 36 | XR25 |
| 60 | EM51 |
| 62 | EM51 |
| 70 | EM51 |
| 82 | EM51 |
| 111 | EM51 |
| 112 | XR25 |
| 118 | XR25 |
| 152 | XR25 |
| 146 | XR25 |

The combination of the input trigger circuit 10, the timing circuit 12 and the output trigger circuit 13, as shown in FIGURES 1 and 3, thus produce an output pulse at a predetermined time following an input pulse except when an input pulse resets the circuits before the output pulse is produced. There is thus provided a resettable delay flop.

What is claimed is:

1. A delay flop comprising an amplifier having an input circuit and an output circuit, transformer means coupling said input and output circuits for regenerative feedback, said amplifier being normally biased to a cutoff condition, means including said transformer means for biasing said amplifier to a conductive state in response to a trigger signal, said transformer means supplying a feedback signal to said input circuit tending to maintain said conductive state, a capacitor connected in said output circuit so that said capacitor is charged by current in said output circuit resulting from conduction in said amplifier, a diode in series circuit with said capacitor and poled to carry current in said output circuit when said amplifier is in said conductive state, first circuit means operative to back bias said diode and return said amplifier to cutoff when the charge on said capacitor reaches a predetermined value, second circuit means for discharging said capacitor after said diode has been back biased, and means for producing a signal when said capacitor has discharged to another predetermined potential.

2. A delay flop as called for in claim 1 in which said amplifier is a transistor.

3. A delay flop as called for in claim 1 in which said first circuit includes a clamp circuit operable to cutoff said amplifier when said capacitor has been charged to said predetermined value.

4. A delay flop as called for in claim 1 in which said second circuit means comprises a variable resistor in shunt circuit with said capacitor for determining the time required to discharge said capacitor to said other predetermined potential.

5. A resettable delay flop comprising a transistor amplifier having an emitter, a collector and a base, a feedback transformer, means connecting the primary of said transformer in series with said collector, means connecting the secondary of said transformer between said base and said emitter so that an increasing current flow from said collector causes a forward bias between said base electrode and said emitter, a capacitor interposed in circuit between said collector and said emitter so that said capacitor is charged when said transistor is in a conductive state, a source of input trigger pulses coupled to said collector for selectively effecting a forward bias between said base and said emitter by way of said feedback transformer to cause said transistor to become conductive, a source of potential and a diode in circuit with said base, said source of potential and said diode being connected to make said diode conductive when that terminal of said capacitor nearest said emitter substantially reaches the potential of said source so that the bias between said emitter and said base is decreased to cause said transistor to become non-conductive, a discharge circuit for discharging said capacitor when said transistor is in the non-conductive state, and an output circuit responsive to the charge on said capacitor for producing a signal when said capacitor has discharged to a certain value.

6. A resettable delay flop comprising an amplifier having an input circuit and an output circuit, transformer means coupling said circuits in feedback relationship, said amplifier being normally biased to a cutoff condition, means for biasing said amplifier to a conductive state in response to a trigger signal, said feedback coupling means supplying a feedback signal to said input circuit from said output circuit tending to maintain said conductive state, a capacitor connected in said output circuit so that said capacitor is charged by the current in said output circuit resulting from conduction in said amplifier, said feedback means being operative to reverse the polarity of said feedback in response to said capacitor becoming charged to a certain potential to cause said conducting state to be terminated, circuit means for discharging said capacitor when said amplifier becomes nonconductive and means responsive to the charge on said capacitor for producing a signal when said capacitor has discharged to a certain potential.

7. A delay flop comprising an amplifier having an input circuit and an output circuit coupled to produce a regenerative feedback in response to an increase of the output of said amplifier and to produce a degenerative feedback in response to a decrease in the output of said amplifier, said amplifier being normally biased to a cut-off condition, means for biasing said amplifier to a conductive state in response to an input trigger signal, a capacitor connected in said output circuit so that said capacitor is charged by the current in said output circuit during the period when said feedback is regenerative, means for causing said feedback to change from regenerative feedback to degenerative feedback when said capacitor becomes charged to a certain potential, circuit means for discharging said capacitor after said feedback has become degenerative, and means responsive to the discharge of said capacitor to a certain potential for producing a signal whereby said signal is produced in response to said input trigger signal after a predetermined delay.

8. A delay flop comprising an amplifier having an input circuit and an output circuit coupled in feedback ralationship, said amplifier being normally biased to a cutoff condition, means for biasing said amplifier to a conductive state in response to an input trigger signal, a capacitor connected in said output circuit so that said capacitor is charged by the current in said output circuit resulting from conduction in said amplifier, said feedback relationship between said input circuit and said output circuit tending to maintain said amplifier in a conductive state after said trigger signal has ceased, clamp circuit means operable to alter said feedback relationship from a regenerative one which maintains conduction in said amplifier to a degenerative one which cuts off said amplifier, said clamp circuit means being operable in response to said capacitor becoming charged to a certain predetermined potential as established by said clamp circuit, circuit means for discharging said capacitor when said amplifier is non-conductive, and means for producing a signal in response to said capacitor being discharged to a certain predetermined potential.

9. A delay flop as in claim 8 in which said means for producing a signal when said capacitor has discharged to a certain predetermined potential includes an output trigger circuit, said output trigger circuit being reset to a first state during the charging of said capacitor past a first potential and being set to a second state upon the discharge of said capacitor past a second potential.

10. A resettable delay flop comprising an input trigger circuit, a timing circuit, and an output trigger circuit; said input trigger circuit including means for producing a trigger pulse in response to an input signal thereto; said timing circuit including an amplifier having an input circuit and an output circuit, said input circuit and said output circuit being coupled in feedback relationship so that a regenerative feedback produced in said amplifier maintains conduction therein and a degenerative feedback cuts off said amplifier, a capacitor connected in the output circuit so that said capacitor is charged by the current in said output circuit during conduction in said amplifier, clamp circuit means operable to cause said feedback to become degenerative to cut off current flow through said capacitor when said capacitor is charged to a predetermined potential, unilateral current conducting means interposed between said capacitor and said amplifier, said unilateral current conducting means being poled to prevent discharge of said capacitor through said amplifier, and a discharge circuit in shunt with said capacitor for discharging said capacitor when said amplifier is non-conductive; said output trigger circuit including means responsive to the discharge of said capacitor to a predetermined potential for setting said output trigger circuit to produce an output signal in response to the charge of said capacitor to a predetermined potential for resetting said output trigger circuit.

11. In a delay flop the combination of a transistor amplifier having an emitter, a base and a collector, a feedback transformer having a primary winding in circuit with said collector and a secondary winding in circuit between said base and said emitter, said primary and secondary windings being wound to produce an increase in the forward potential between said base and said emitter by way of said secondary winding when the collector current in said primary winding is increasing so that said transformer produces a regenerative increase in the collector current, means for biasing said emitter, base and collector so that said amplifier is normally non-conductive, means connecting a source of trigger pulses to said primary winding in polarity to induce in said secondary winding a potential forward biasing the base and emitter to change said amplifier to a conductive state, a capacitor in a return circuit between said collector and said emitter for receiving a charging current flow during conduction of said transistor, clamp means including a source of clamping potential coupled through a diode to said base, said clamp means being operative to prevent said base from having a potential below that of said clamp potential so that the charging of said capacitor to said clamp potential prevents an increase in the potential between said base and emitter a discharge circuit in shunt with said capacitor, a diode interposed in series circuit with said capacitor and said emitter and operative to prevent discharge of said capacitor through circuits other than said discharge circuit, and output trigger circuit means responsive to a discharge of said capacitor to a predetermined potential for producing an output signal.

12. A delay flop comprising a transistor having an emitter, collector and base, an input circuit between said emitter and said base, an output circuit between said collector and said emitter, a transformer coupling said output circuit and said input circuit, said output circuit including the primary of said transformer, said input circuit including the secondary of said transformer connected for regenerative feedback between said output circuit and said input circuit, a first diode and a capacitor in series connection between said collector and said emitter, said first diode being between said emitter and said capacitor and poled to carry current from said collector to said emitter, a source of input signals, means connecting said source of input signals to said collector, a second diode connected between a reference potential and said emitter and poled to prevent the potential of said emitter from rising above said reference potential, a third diode connecting said base and said emitter and poled to be back biased by the potential in said transformer secondary product in response to said input signal, a threshold potential source, a fourth diode coupling said threshold potential source to said base, said diode being poled to prevent the potential of said base from going below the potential of said threshold potential source so that the base-emitter bias of said transistor is reduced to make said transistor non-conductive when the charge on said capacitor causes conduction of said fourth diode, another potential source and means connecting said other potential source to said base so that said base and said emitter are maintained at said reference potential when said transistor is non-conductive, a discharge circuit connected across said capacitor and operable to discharge said capacitor when said transistor is non-conductive, and a trigger circuit connected to a point between said first diode and said capacitor and operable to produce an output signal at a certain time after the last input signal in dependence upon the time constant of said discharge circuit.

References Cited in the file of this patent

UNITED STATES PATENTS 2,939,040 Isabeou ---------------- May 31, 1960